US012148630B2

(12) United States Patent
Chen et al.

(10) Patent No.: US 12,148,630 B2
(45) Date of Patent: Nov. 19, 2024

(54) METHOD FOR MANUFACTURING ELECTRONIC DEVICE

(71) Applicant: InnoLux Corporation, Miao-Li County (TW)

(72) Inventors: Yeong-E Chen, Miao-Li County (TW); Cheng-En Cheng, Miao-Li County (TW); Yu-Ting Liu, Miao-Li County (TW); Cheng-Chi Wang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 519 days.

(21) Appl. No.: 17/507,915

(22) Filed: Oct. 22, 2021

(65) Prior Publication Data

US 2023/0077312 A1    Mar. 9, 2023

(30) Foreign Application Priority Data

Sep. 3, 2021    (CN) .......................... 202111031500.8

(51) Int. Cl.
*H01L 21/48*        (2006.01)
*H01L 21/66*        (2006.01)
*H01L 23/544*       (2006.01)
*H01L 21/683*       (2006.01)

(52) U.S. Cl.
CPC .......... *H01L 21/4857* (2013.01); *H01L 22/22* (2013.01); *H01L 23/544* (2013.01); *H01L 21/6835* (2013.01); *H01L 2221/68345* (2013.01); *H01L 2223/54426* (2013.01)

(58) Field of Classification Search
CPC ... H01L 21/4857; H01L 22/22; H01L 23/544; H01L 21/6835; H01L 2223/54426
See application file for complete search history.

(56) References Cited

U.S. PATENT DOCUMENTS

| | | | |
|---|---|---|---|
| 8,580,614 B2 | 11/2013 | Yu et al. | |
| 11,063,016 B2 | 7/2021 | Yu et al. | |
| 2012/0028411 A1* | 2/2012 | Yu .......................... | H01L 21/561 |
| | | | 438/118 |
| 2020/0043891 A1* | 2/2020 | Yu .......................... | H01L 24/81 |
| 2020/0366050 A1 | 11/2020 | McLaurin et al. | |

FOREIGN PATENT DOCUMENTS

| | | |
|---|---|---|
| CN | 102347251 B | 5/2013 |
| CN | 107180795 B | 9/2019 |

OTHER PUBLICATIONS

Chinese language office action dated Jul. 4, 2022, issued in application No. TW 111100352.

* cited by examiner

*Primary Examiner* — Vishal I Patel
(74) *Attorney, Agent, or Firm* — McClure, Qualey & Rodack, LLP

(57) ABSTRACT

The application relates to a method for manufacturing an electronic device, and in particular, to a method for manufacturing an electronic device with a carrier substrate. The method includes: providing a carrier, forming a first base layer on the carrier; and forming working units on the first base layer. The working units are spaced apart from one another.

19 Claims, 9 Drawing Sheets

METHOD FOR MANUFACTURING ELECTRONIC DEVICE

CROSS REFERENCE TO RELATED APPLICATIONS

This application claims priority of China Patent Application No. 202111031500.8, filed on Sep. 3, 2021, the entirety of which is incorporated by reference herein.

BACKGROUND

Technical Field

The disclosure relates to a method for manufacturing an electronic device, and in particular, to a method for manufacturing an electronic device with a carrier substrate.

Description of the Related Art

As consumers prefer thinner and lighter electronic products, related electronic devices tend to be miniaturized. Therefore, it is an urgent need to propose a method for manufacturing an electronic device with reduced size, improved performance, or lower cost.

For example, fan-out panel-level package (FOPLP) technology is currently a much more advanced package technology. Although the chip size continues to scale down, FOPLP technology may provide a highly integrated package structure by extending wiring in a fan-out manner from the area where the die is configured. FOPLP technology attracts attention due to high potential for development. However, many challenges still remain in the manufacturing process with FOPLP technology. Accordingly, various solutions to the bottleneck of the manufacturing process are still in need to improve reliability and yield of the electronic devices.

BRIEF SUMMARY OF THE DISCLOSURE

A method for manufacturing an electronic device is provided according to some embodiments of the disclosure. The method includes: providing a carrier substrate; forming a first base layer on the carrier substrate; and forming working units on the first base layer. The working units are spaced apart from one another.

The features and the advantages of the disclosure may be more fully understood by reading the subsequent detailed description and examples with references made to the accompanying drawings.

DETAILED DESCRIPTION OF THE DISCLOSURE

The method for manufacturing an electronic device provided in the disclosure is described in detail in the following description. It should be appreciated that the following disclosure provides many different embodiments, or examples, for implementing different features of the disclosure. Specific examples of elements and arrangements are described below to clearly describe the disclosure in a simple manner. These are, of course, merely examples and are not intended to be limiting. In addition, different embodiments may use like and/or corresponding reference numerals to denote like and/or corresponding elements for clarity. However, like and/or corresponding reference numerals are used merely for the purpose of clarity and simplicity, and do not suggest any correlation between different embodiments.

It should be appreciated that the drawings of the disclosure are not drawn to scale. In fact, the dimensions of the various elements may be arbitrarily increased or reduced for clarity of the features of the disclosure.

In addition, the expression "a layer is disposed above another layer" or "a layer is disposed on another layer" may indicate that the layer is in direct contact with the other layer, or that the layer is not in direct contact with the other layer, there being one or more intermediate layers disposed between the layer and the other layer.

It should be understood that, in the specification and the appended claims, the ordinal numbers like "first" and "second" are just descriptive of the elements following them and do not mean or signify that the elements are so numbered, that one claimed element is arranged with another claimed element in that order, or that the claimed elements are produced in that order. These ordinal numbers are only used to differentiate one claimed element having a denomination from another claimed element having the same denomination. The same denomination may not be used in the specification and the appended claims. For example, the first element in the specification may be the second element in the appended claims.

The terms "about" typically means +/−10% of the stated value, or typically means +/−5% of the stated value, or typically means +/−3% of the stated value, or typically means +/−2% of the stated value, or typically means +/−1% of the stated value, or typically means +/−0.5% of the stated value. The stated value of the disclosure is an approximate value. When there is no specific description, the stated value includes the meaning of "about". In addition, the expression "greater than or equal to the first value and less than or equal to the second value" indicates that the range described includes the first value, the second value, and other values therebetween.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the disclosure and the background or the context of the disclosure, and should not be interpreted in an idealized or overly formal manner unless so defined.

In accordance with the embodiments of the disclosure, an optical microscopy (OM), a scanning electron microscope (SEM), a film thickness profiler (α-step), an ellipsometer or other suitable methods may be used to measure the spacing or distance between elements, or the width, thickness, height, or area of each element. In particular, in accordance with some embodiments, a scanning electron microscope may be used to obtain any cross-sectional image including the elements to be measured, and the spacing or distance between elements, or the width, thickness, height, or area of each element in the image may be measured.

It should be understood that the following embodiments can be substituted, reorganized, and mixed to complete other embodiments without departing from the spirit of the present disclosure. As long as the features of the embodiments do not violate the spirit of the invention or conflict, they can be mixed and matched arbitrarily.

It should be understood that the electronic device of the disclosure may include a package device, a display device, an antenna device, a touch display device, a curved display device, or a non-rectangular electronic device (free shape display), but the disclosure is not limited thereto. The electronic device can be a bendable or flexible electronic device. The electronic device may, for example, include light-emitting diodes, liquid crystals, fluorescence, phosphors, other suitable display media, or a combination of the foregoing, but the disclosure is not limited thereto. The light-emitting diodes may include, for example, organic light-emitting diodes (OLEDs), inorganic light-emitting diodes, sub-millimeter light-emitting diodes (sub-mini LEDs), and micro-light-emitting diodes (micro-LED), quantum dots light-emitting diodes (e.g., QLED or QDLED), other suitable materials, or any combination thereof, but the disclosure is not limited thereto. The display device may include, for example, a splicing display device, but the disclosure is not limited thereto. The concept or principle of the disclosure may be applied to a non-emissive liquid crystal display (LCD), but the disclosure is not limited thereto.

The antenna device may include, for example, a liquid crystal antenna or other types of antennas, but the disclosure is not limited thereto. The antenna device may include, for example, an antenna splicing device, but the disclosure is not limited thereto. It should be noted that the electronic device can be any combination of the foregoing, but the disclosure is not limited thereto. In addition, shape of the electronic device may be rectangular, circular, polygonal, a shape with curved edges, or other suitable shapes. The electronic device may have peripheral systems such as a driving system, a control system, a light source system, a rack system, etc., to support a display device, an antenna device, or a splicing device. For example, the electronic device of the disclosure may be a display device, but the disclosure is not limited thereto.

Figure 1A:
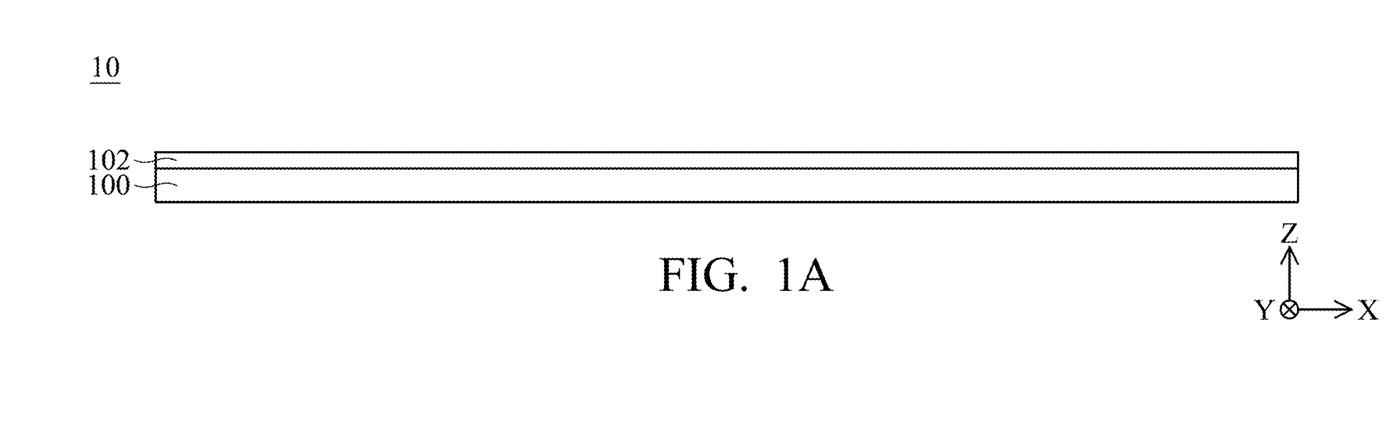
FIGS. 1A-1B are cross-sectional views illustrating an electronic device at various intermediate stages of its manufacturing process according to some embodiments of the disclosure.
Figure 1B:
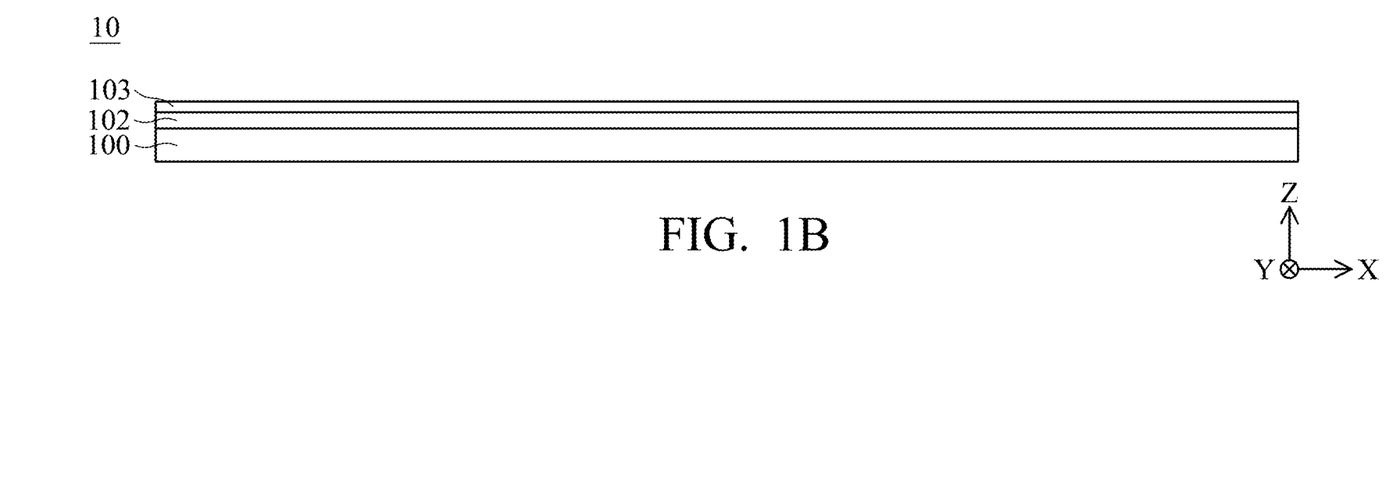

FIGS. 1A-1B are cross-sectional views illustrating a process for manufacturing an electronic device 10 according to some embodiments of the disclosure. Referring to FIG. 1A, providing a carrier substrate 100, and forming a first base layer 102 on the carrier substrate 100. According to some embodiments, devices formed on the carrier substrate 100 may be removed from the carrier substrate 100, and the carrier substrate 100 may be re-used for the manufacture of the electronic device 10, but the disclosure is not limited thereto. The material of the carrier substrate 100 may include quartz, glass, stainless steel, sapphire, other suitable materials, or a combination thereof, but the disclosure is not limited thereto. In some embodiments, the first base layer 102 may include an adhesive thermal-type release material or an adhesive optical-type release material, enabling subsequently formed working units, devices or layers to temporarily attach to the first base layer 102. In other words, the first base layer 102 may be beneficial for removal of the working units, devices or layers subsequently formed on the carrier substrate 100 from the carrier substrate 100. In the embodiments where a thermal-type release material is used for forming the first base layer 102, the thermal-type release material may lose its adhesive characteristics when the thermal-type release material is subjected to heating, and the devices or layers formed thereon may be lifted off from the first base layer 102. For example, in some embodiments, the thermal-type release material may include resin, epoxy, acrylic acid, polyethylene terephthalate (PET)-based polymer materials, or other suitable materials, but the disclosure is not limited thereto.

The optical-type release material may be a release material with a light-thermal conversion characteristic. In the embodiments where an optical-type release material is used for forming a first base layer 102, the optical-type release material may, for example, absorb laser light and lose its adhesive characteristic, enabling the devices or layers formed thereon to be lifted off from the first base layer 102. Specifically, the optical-type release material may absorb laser light having a wavelength that is greater than or equal to about 250 nm and less than or equal to about 1100 nm, indicating that the laser absorption peak of the optical-type release material may be greater than or equal to about 250 nm and less than or equal to about 1100 nm. The term "laser absorption peak" used herein means the wavelength of laser light when the optical-type release material has the maximum laser absorbance. For example, in some embodiments, the optical-type release material may include polyimide or other suitable materials, but the disclosure is not limited thereto.

In other embodiments, referring to FIG. 1B, the first base layer 102 may include a non-adhesive base material. Therefore, a first adhesive layer 103 may be further formed on the first base layer 102. For example, the non-adhesive base material may include silicon oxide ($SiO_x$), silicon nitride ($SiN_x$), silicon oxynitride ($SiO_xN_y$), or other suitable materials, but the disclosure is not limited thereto. In addition, in some embodiments, the first adhesive layer 103 may include poly-carbonate, polycarbodiimide, epoxy resin, poly-vinyl acetal, acrylic resin, polyester, other suitable adhesive materials, or a combination thereof, but the disclosure is not limited thereto. In particular, according to some embodiments, the first adhesive layer 103 may have a thermal release property or an optical release property.

Figure 2A:
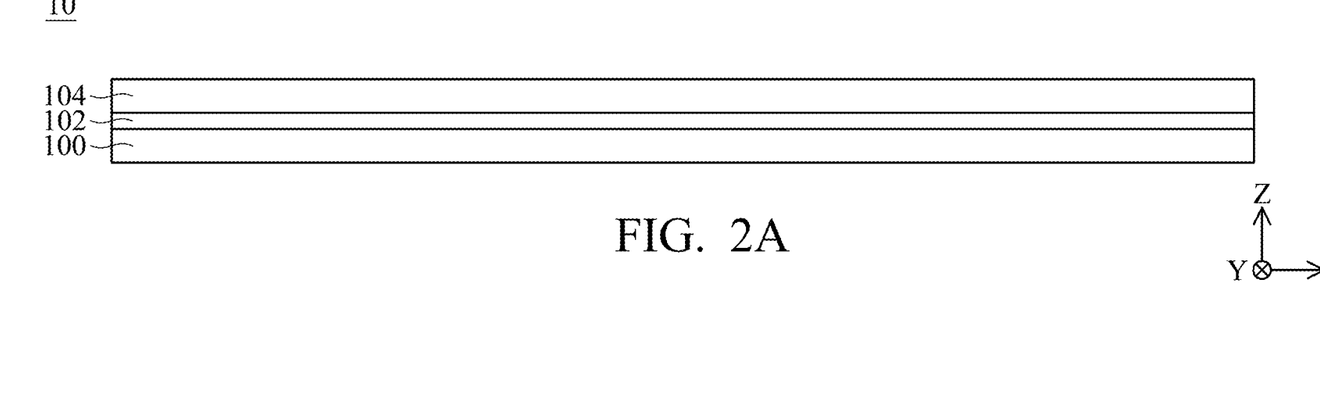
FIGS. 2A-2C are cross-sectional views illustrating different methods for forming sub-carriers according to various embodiments of the disclosure.
Figure 2B:
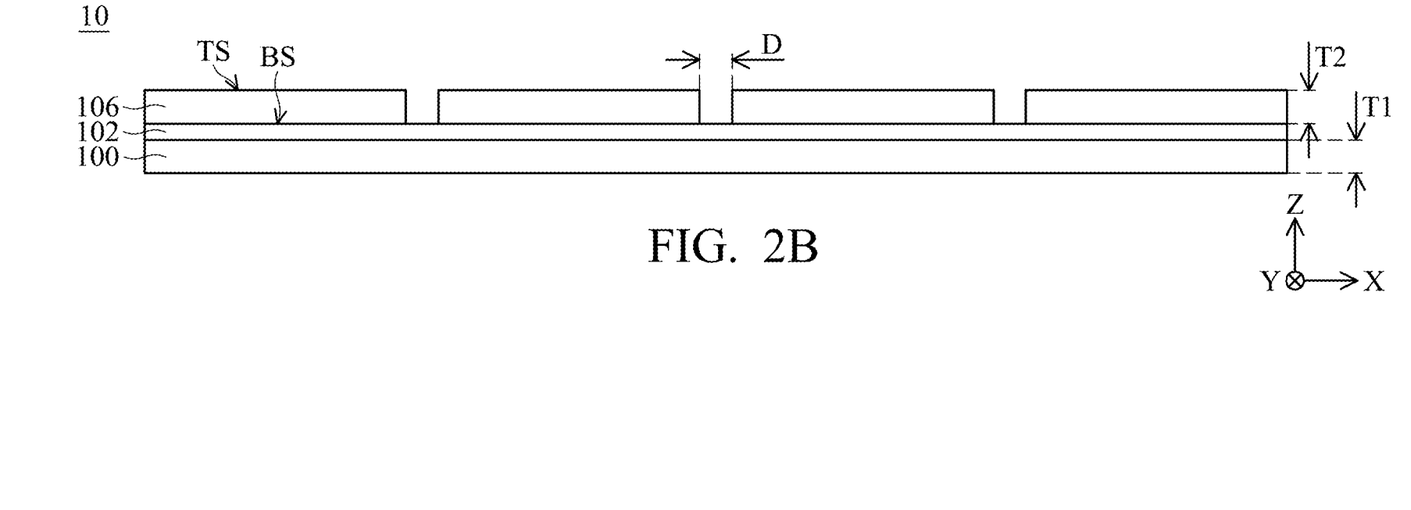
Figure 2C:
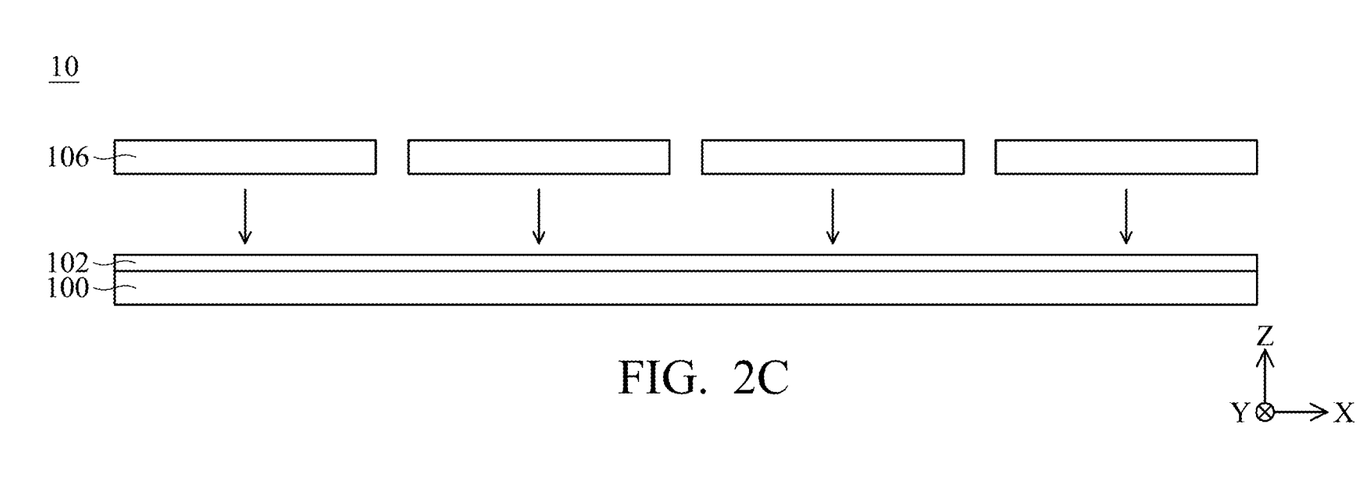

Next, referring to FIGS. 2A-2C, FIGS. 2A-2C are cross-sectional views illustrating different methods for forming sub-carriers 106 according to various embodiments of the disclosure. In some embodiments, as shown in FIGS. 2A-2B, a substrate 104 may be first formed on the first base layer 102, and cutting the substrate 104 into the sub-carriers 106 that are spaced apart from one another using suitable cutting methods. According some embodiments, the suitable cutting methods may include etching, wheel cutting, laser cutting, other applicable cutting techniques, or a combination thereof. Alternatively, in other embodiments, as shown in FIG. 2C, a plurality of sub-carriers 106 with an adequate size may be also attached directly to the first base layer 102, and the sub-carriers 106 are spaced apart from one another after attachment. It should be appreciated that although the sub-carriers 106 are shown to be spaced apart from one another along the X direction, the sub-carriers 106 may be also spaced apart from one another along the Y direction (as shown in FIG. 5C). According to some embodiments, the substrate 104 in FIG. 2A and the sub-carriers 106 in FIG. 2C may include quartz, glass, stainless steel, sapphire, other suitable materials, or a combination thereof, but the disclosure is not limited thereto. In some embodiments, the carrier substrate 100 and the sub-carriers 106 may have different materials, but the disclosure is note limited thereto.

Moreover, the dimension of the sub-carriers 106 may be determined by the smallest maximum optimized process area (MOPA) in the following processes for forming connecting structures in the working units. The term "MOPA" means the maximum process area achieved during the optimization of one process. In addition, the term "working unit" used herein means an individual device or a stacking layers structure formed on the carrier substrate 100 in a normal direction (e.g., the Z direction) to the carrier substrate 100. Different processes may have different MOPAs, and thus the dimension of the sub-carriers 106 is determined using the smallest MOPA among the processes. The sub-carriers 106 may be the carrier substrates of the working units, but the disclosure is not limited thereto. In some embodiments, the area of the sub-carriers 106 in the top-view may be greater than or equal to about 1 time the smallest MOPA, and may be less than or equal to about 1.5 times the smallest MOPA.

Additionally, as shown in FIG. 2B, a spacing D between the adjacent sub-carriers 106 may be determined by area utilization of the carrier substrate 100 and according to accuracy requirement for the attachment and lift-off processes of the sub-carriers 106. The spacing D may be, for example, the distance between the adjacent sub-carriers 106 along the X direction or the Y direction. In some embodiments, the spacing D between the adjacent sub-carriers 106 may be greater than or equal to about 1 mm and less than or equal to about 50 mm, or may be greater than or equal to about 3 mm and less than or equal to about 40 mm, or may be greater than or equal to about 5 mm and less than or equal to about 30 mm, but the disclosure is not limited thereto. If the spacing between the adjacent sub-carriers 106 is too high, the yield and manufacturing efficiency of the electronic device 10 may be too low. If the spacing between the adjacent sub-carriers 106 is too low, the following processes for the individual working unit, such as removal of the individual working unit from the carrier substrate 100, may cause damage or defects to the adjacent working units. On the other hand, some space on the sub-carriers 106 will remain for the formation of test-keys for process control monitoring. Alternatively, the space between the adjacent sub-carrier 106 may be also used for the formation of the test-keys for process control monitoring to monitor the process variations, to evaluate process window, or to detect possible defects present in the working units, but the disclosure is not limited thereto.

For example, the electronic device 10 may be formed by a FOPLP process. The FOPLP process may form working units directly on a carrier substrate formed of glass and with high surface area. However, the glass carrier substrate and the materials used for forming the electronic device 10 may have different stiffness. The term "stiffness" used herein refers to the extent to which a material is deformed by external forces. Any conditions that may cause the devices of the disclosure to deform may belong to the external forces indicated in the disclosure. For example, the coefficient of thermal expansion of an insulating layer in the electronic device 10 may be in a range between about 20 ppm/and about 40 ppm/D, whereas the coefficient of thermal expansion of the glass carrier substrate may be in a range between about 9 ppm/and about 20 ppm/D. The manufacturing process of the electronic device 10 may include a heating step, which may cause the insulating layer or the glass carrier substrate to deform. The degree of deformation or stiffness of the insulating layer and the glass carrier substrate may be different due to the difference in the coefficient of thermal expansion between the insulating layer and the glass carrier substrate, and the carrier substrate is prone to have warpage accordingly. The warpage of the carrier substrate may affect the following processes. For example, exposure pattern distortion may occur during the following lithography process, disabling the resulting working units or electronic devices to meet the desired design requirement. In addition, if the working units formed on the carrier substrate have defects, the whole carrier substrate and all of the working units formed thereon may be disposed of, or some local areas of the carrier substrate may be subjected to reworking or repair. Although the working units within these local areas may recover, some known good working units within the adjacent area may be also damaged during the repairing process, leading to impact on the process yield.

According to the embodiments provided by the disclosure, multiple sub-carriers with a smaller area are disposed on the carrier substrate, and used as a minimum unit to complete desired working units. It should be understood that each sub-carrier is included in one individual working unit according to the embodiments of the disclosure. As such, warpage of the carrier substrate may be reduced. Furthermore, if a working unit is identified to have defects, the working unit may be lifted off from the carrier substrate and subjected to repair, preventing damage to the working units within the adjacent area. The recovered known good working unit may be re-attached to the carrier substrate for further processing. Moreover, since the first base layer is formed on the carrier substrate, the working units may be lifted off from the carrier substrate after completing the working units, and new working units may be subsequently formed on the carrier substrate. The same carrier substrate may be re-used, and thus the material with high stiffness, high mechanical strength, or high tolerance that is not prone to deform and may be useable can be used for the carrier substrate to avoid warpage of the carrier substrate during the manufacturing process of the electronic device.

In some embodiments, the carrier substrate 100 and the sub-carriers 106 may have different stiffness. Generally, the stiffness of the of the carrier substrate 100 and the sub-carriers 106 may be determined by several indices, such as thickness, coefficient of thermal expansion (CTE), Young's modulus, other suitable indices, or a combination thereof, which will be described below in detail. According to some embodiments, the carrier substrate 100 has a thickness T1 along the Z direction (the normal direction to the carrier substrate 100), and the sub-carriers 106 have a thickness T2 along the Z direction (the normal direction to the carrier substrate 100). The thicknesses T1 and T2 may be the same or different. The thickness mentioned in the disclosure is the distance between a top surface of a substrate and a bottom surface of the substrate, such as the distance between a top surface TS and a bottom surface BS of the sub-carriers 106 in FIG. 2B, but the disclosure is not limited thereto. In one embodiment, the thickness T1 of the carrier substrate 100 may be greater than the thickness T2 of the sub-carriers 106. In some embodiments, the thickness T1 of the carrier substrate 100 may be greater than or equal to about 0.7 mm and less than or equal to about 1.5 mm, and the thickness T2 of the sub-carriers 106 may be greater than or equal to about 0.3 mm and less than or equal to about 1.1 mm, but the disclosure is not limited thereto. According to some embodiments, the CTE of the carrier substrate 100 may be different from the CTE of the sub-carriers 106. In one embodiment, the CTE of the carrier substrate 100 may be less than the CTE of the sub-carriers 106. In some embodiments, the CTE of the carrier substrate 100 may be greater than or equal to about $9 \times 10^{-6}/\square$ and less than or equal to about $20 \times 10^{-6}/\square$, and the CTE of the sub-carriers 106 may be greater than or equal to about $9 \times 10^{-6}/\square$ and less than or equal to about $20 \times 10^{-6}/\square$. According to some embodiments, the Young's modulus of the carrier substrate 100 may be different from the Young's modulus of the sub-carriers 106. In one embodiment, the Young's modulus of the carrier substrate 100 may be less than the Young's modulus of the sub-carriers 106. In some embodiments, the Young's modulus of the carrier substrate 100 may be greater than or equal to about 70 GPa and less than or equal to about 220 GPa, and the Young's modulus of the sub-carriers 106 may be greater than or equal to about 50 GPa and less than or equal to about 90 GPa. For example, when the carrier substrate 100 and the sub-carriers 106 have the same thickness, the CTE of the carrier substrate 100 may be greater than the CTE of the sub-carriers 106. Alternatively, when the carrier substrate 100 and the sub-carriers 106 have the same CTE, the thickness of the carrier substrate 100 may be greater than the thickness of the sub-carriers 106, but the disclosure is not limited thereto. In the disclosure, the carrier substrate has a different stiffness than the sub-carriers, thereby reducing warpage of the carrier substrate generated during the manufacturing process of the electronic device and increasing flexibility of the manufacturing process of the electronic device, but the disclosure is not limited thereto.

According to some embodiments, the CTEs of the carrier substrate 100 and the sub-carriers 106 may be measured using a dilatometer, but the CTE measuring method is not limited thereto. According to some embodiments, the Young's modulus described in the disclosure may be measured using a universal testing machine, but the measuring method of the Young's modulus is not limited thereto. For example, the universal testing machine may be used to obtain the relationship between deformation of the carrier substrate or the sub-carrier and the load, and the Young's modulus may be calculated accordingly. A carrier substrate sample or a sub-carrier sample (e.g., 40 mm×40 mm×1 mm) is placed on the universal testing machine, and the crosshead of the universal testing machine presses the sample at a constant rate of 5 mm/min until the carrier substrate sample or the sub-carrier sample breaks, or until the load of the carrier substrate sample or the sub-carrier sample decreases by 10%.

Figure 3A:
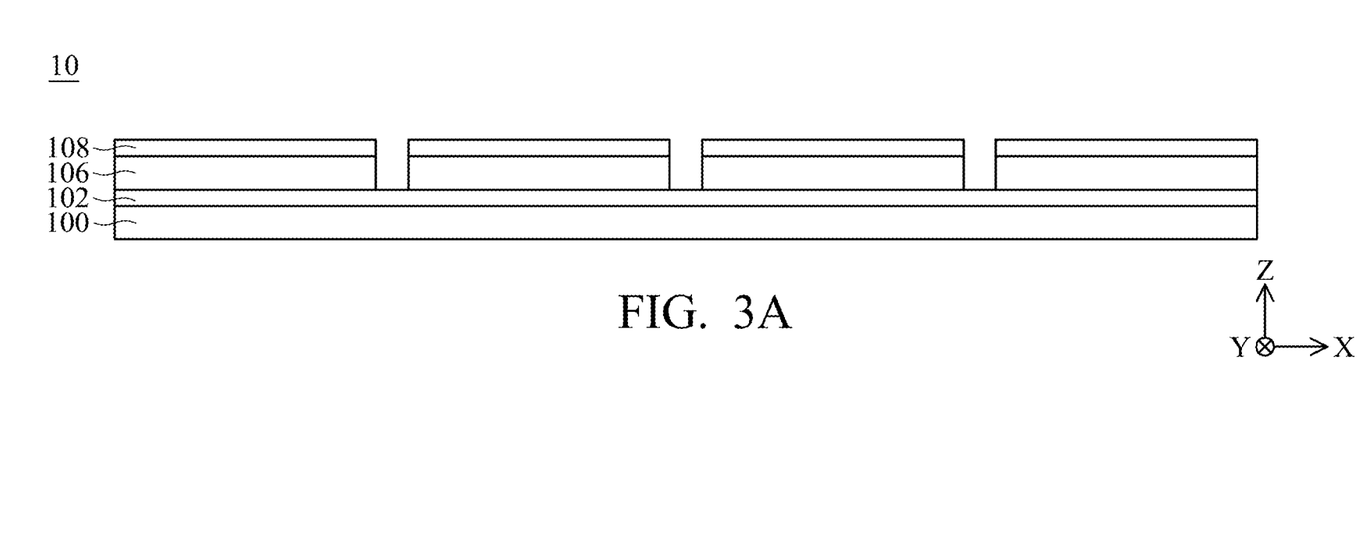
FIGS. 3A-3B are cross-sectional views illustrating an electronic device at various intermediate stages of its manufacturing process according to some embodiments of the disclosure.

Next, FIGS. 3A-3B are cross-sectional views illustrating the electronic device 10 at various intermediate stages of its manufacturing process according to some embodiments of the disclosure. Referring to FIG. 3A, a second base layer 108 is formed on each of the sub-carriers 106. According to some embodiments, the second base layer 108 may include the aforementioned adhesive optical-type release material to enable the connecting structures that are formed subsequently to attach to the sub-carrier 106 through the second base layer 108. It should be noted that, in the embodiments where the first base layer 102 includes the optical-type release material, the optical-type release materials of the second base layer 108 and the first base layer 102 may have different laser absorption peaks. Specifically, optical-type release materials with different material compositions may be used to respectively form the first base layer 102 and the second base layer 108 such that the first base layer 102 and the second base layer 108 have different laser absorption peaks. Therefore, the working unit (including the sub-carrier 106 and the portion formed thereon) may be lifted off from the carrier substrate 100 using the laser light having a wavelength near the laser absorption peak of the first base layer 102, and thus the working unit may be subjected to repair or further processing, or new working units may be formed.

Figure 3B:
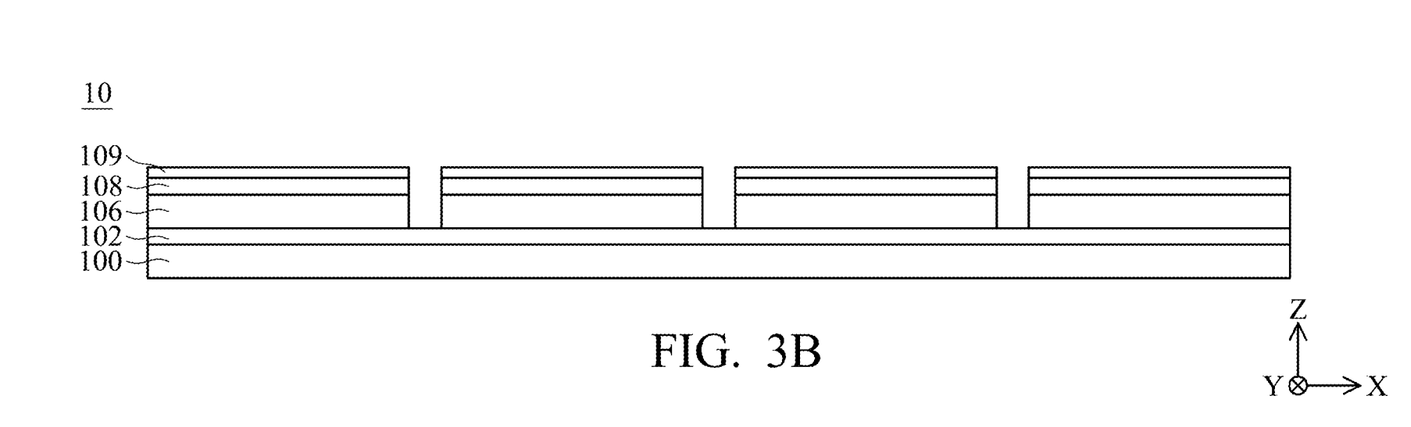

In other embodiments, the second base layer 108 may include the aforementioned non-adhesive base material. In this case, as shown in FIG. 3B, a second adhesive layer 109 may be further formed on the second base layer 108. The material of the second adhesive layer 109 may include poly-carbonate, polycarbodiimide, epoxy resin, poly-vinyl acetal, acrylic resin, polyester, other suitable adhesive materials, or a combination thereof, but the disclosure is not limited thereto. In particular, according to some embodiments, the second adhesive layer 109 may have an optical release property.

Figure 4:
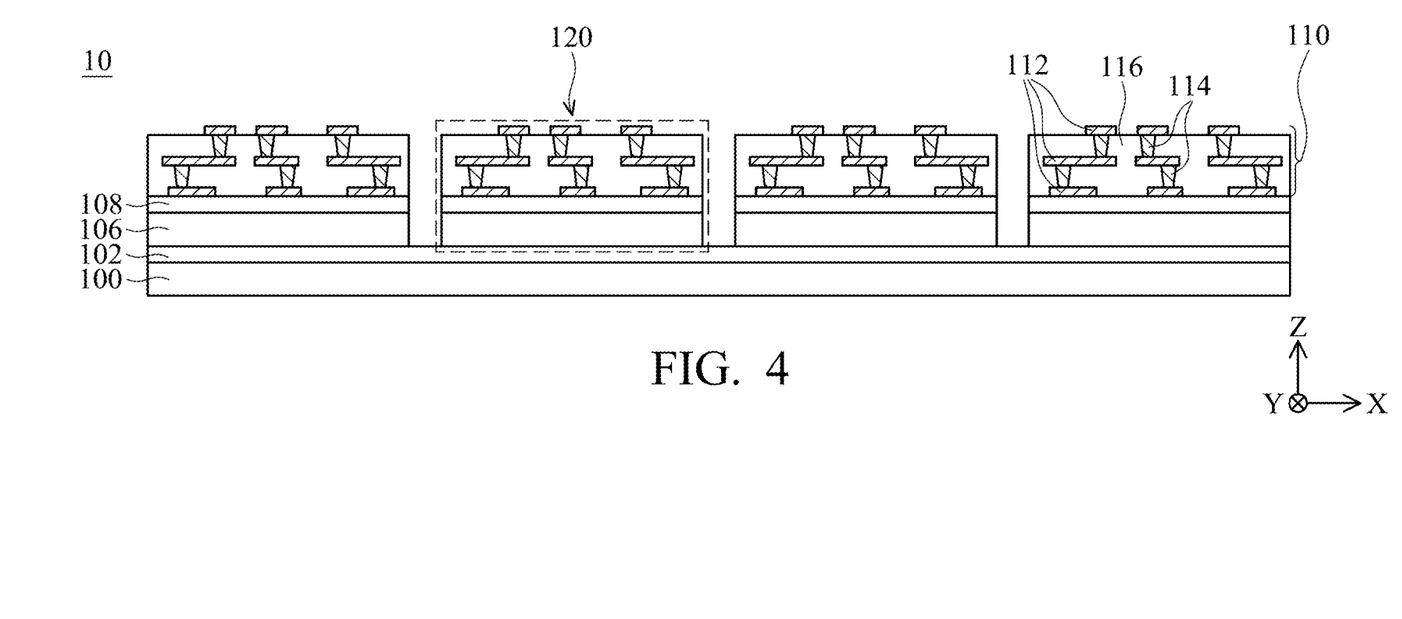
FIG. 4 is a cross-sectional view illustrating the formation of connecting structures according to some embodiments of the disclosure.

Referring to FIG. 4, FIG. 4 is a cross-sectional view illustrating the formation of connecting structures 110 according to some embodiments of the disclosure. As shown in FIG. 4, the connecting structure 110 is formed on each second base layer 108. After completing the connecting structure 110, the sub-carrier 106, the second base layer 108 and the connecting structure 110 may collectively referred to as a "working unit 120". In some embodiments, the connecting structure 110 may be formed, for example, by alternately stacking metal layers 112 and insulating layers 116. The metal layers 112 may be electrically connected to one another through the conductive layers 114. The number of metal layers 112 and conductive layers 114 may be selected according to product requirements. For example, in FIG. 4, each working unit 120 may have three metal layers 112, and the three metal layers 112 are connected through two conductive layers 114, but the disclosure is not limited thereto. In other embodiments, the working unit 120 may include more or fewer metal layers 112 and conductive layers 114. The electronic device 10 of the disclosure may apply to a variety of products. For example, other devices (e.g., integrated circuits (ICs) or passive devices) may be connected to a circuit board through the electronic device 10. In other words, the electronic device 10 may further include bonding pads (not shown), and the circuit board may be electrically connected to an IC through the bonding pads or the connecting structure 110, but the disclosure is not limited thereto.

According to some embodiments, the metal layers 112 and the conductive layers 114 may be, for example, a single-layered material or a material with composite layers. For example, the material may include Al, Cu, W, Ti, Ta, Ni, TiN, TaN, NiSi, CoSi, TaC, TaSiN, TaCN, TiAl, TiAlN, other suitable conductive materials, or a combination thereof, but the disclosure is not limited thereto. The materials of the metal layers 112 and the conductive layers 114 may be deposited by electro-plating, physical vapor deposition (PVD), atomic layer deposition (ALD), metal-organic chemical vapor deposition (MOCVD), other suitable deposition techniques, or a combination thereof.

According to some embodiments, the material of the insulating layers 116 may include a multi-layered structure including one or more dielectric materials. The insulating layers 116 may, for example, include an organic material, an inorganic material, an organic-inorganic composite material, or a combination thereof. The organic material may, for example, include polyimide (PI), siloxane, other suitable organic materials, or a combination thereof, but the disclosure is not limited thereto. The inorganic material may, for example, include silicon oxide, silicon nitride, silicon oxynitride, phosphosilicate glass (PSG), borophosphosilicate glass (BPSG), a low-k dielectric material, other suitable dielectric materials, or a combination thereof, but the disclosure is not limited thereto. In some embodiments, the low-k dielectric material may be fluorinated silica glass (FSG), carbon-doped silicon oxide, amorphous fluorinated carbon, parylene, benzocyclobutenes (BCB), polyimide (PI), other suitable low-k dielectric materials, or a combination thereof, but the disclosure is not limited thereto.

According to some embodiments, the insulating layer 116 may be formed on the first layer of the metal layers 112 after forming the first layer on the metal layers 112 in the connecting structure 110. Subsequently, several openings (not shown) are formed in the insulating layer 116 by a patterning process, and the metal materials are deposited to fill the openings and form the conductive layers 114. The patterning process may include a photolithography process and an etching process. In some embodiments, the photolithography process may include photoresist coating, soft baking, hard baking, mask aligning, exposure, post-exposure baking, developing the photoresist, rinsing, drying, or other suitable processes. In some embodiments, the etching process may include a dry etching process, a wet etching process, or a combination thereof. For example, the dry etching process may include a reactive ion etching (RIE) process, inductively coupled plasma reactive ion etching (ICP-RIE), a plasma etching process, or a combination thereof. Next, more metal layers 112, conductive layers 114, and insulating layers 116 may be formed using the same processed as described above to form the connecting structure 110.

Figure 5A:
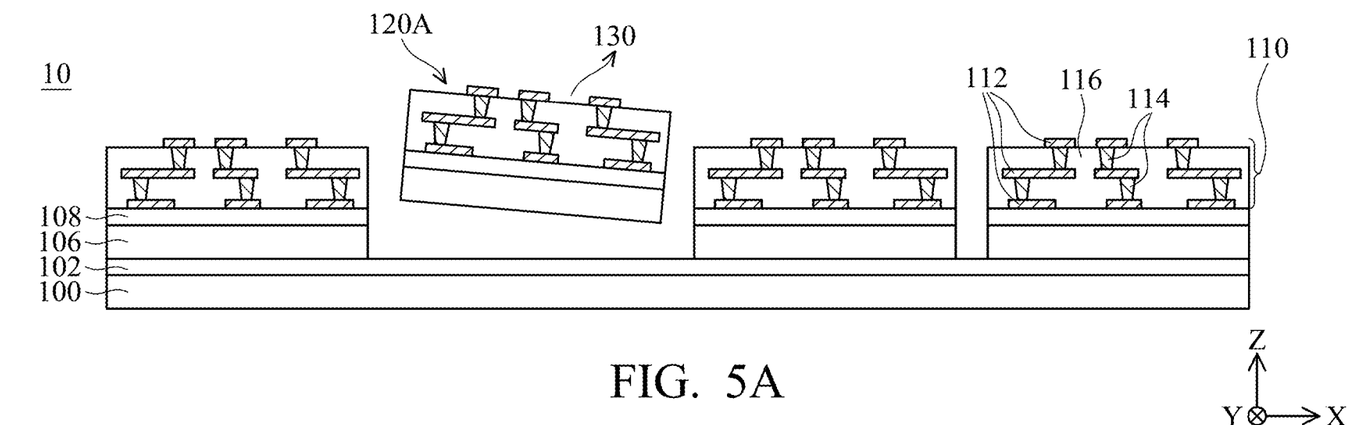
FIG. 5A is a cross-sectional view illustrating removal of a faulty working unit from the carrier substrate after performing a detection step on the working units according to some embodiments of the disclosure.
Figure 5B:
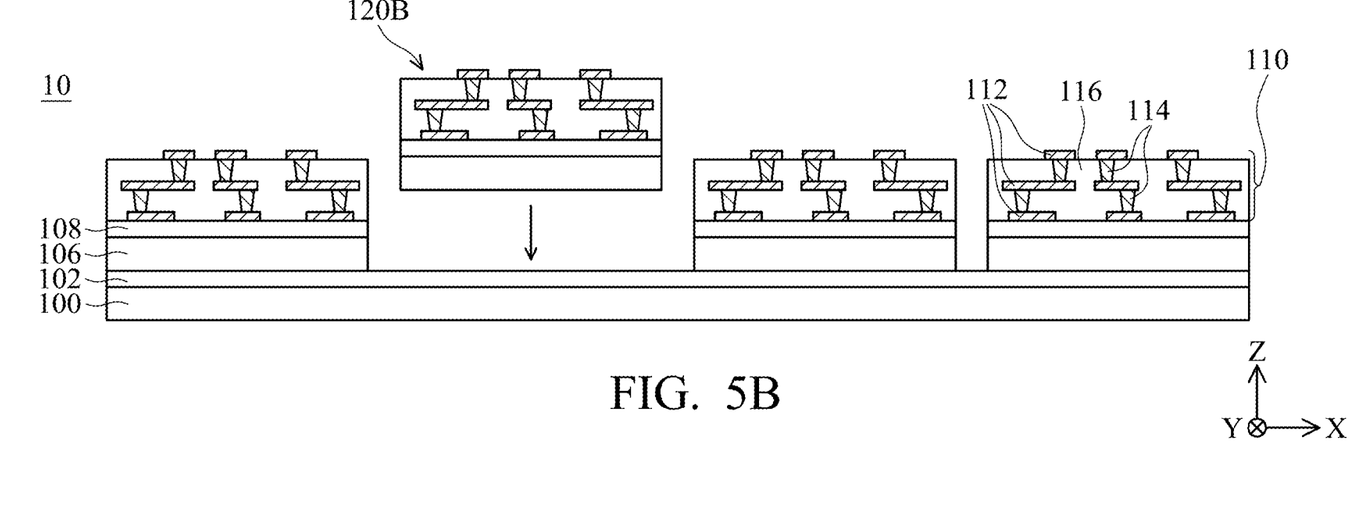
FIG. 5B is a cross-sectional view illustrating attachment of a known good working unit to the carrier substrate according to some embodiments of the disclosure.
Figure 5C:
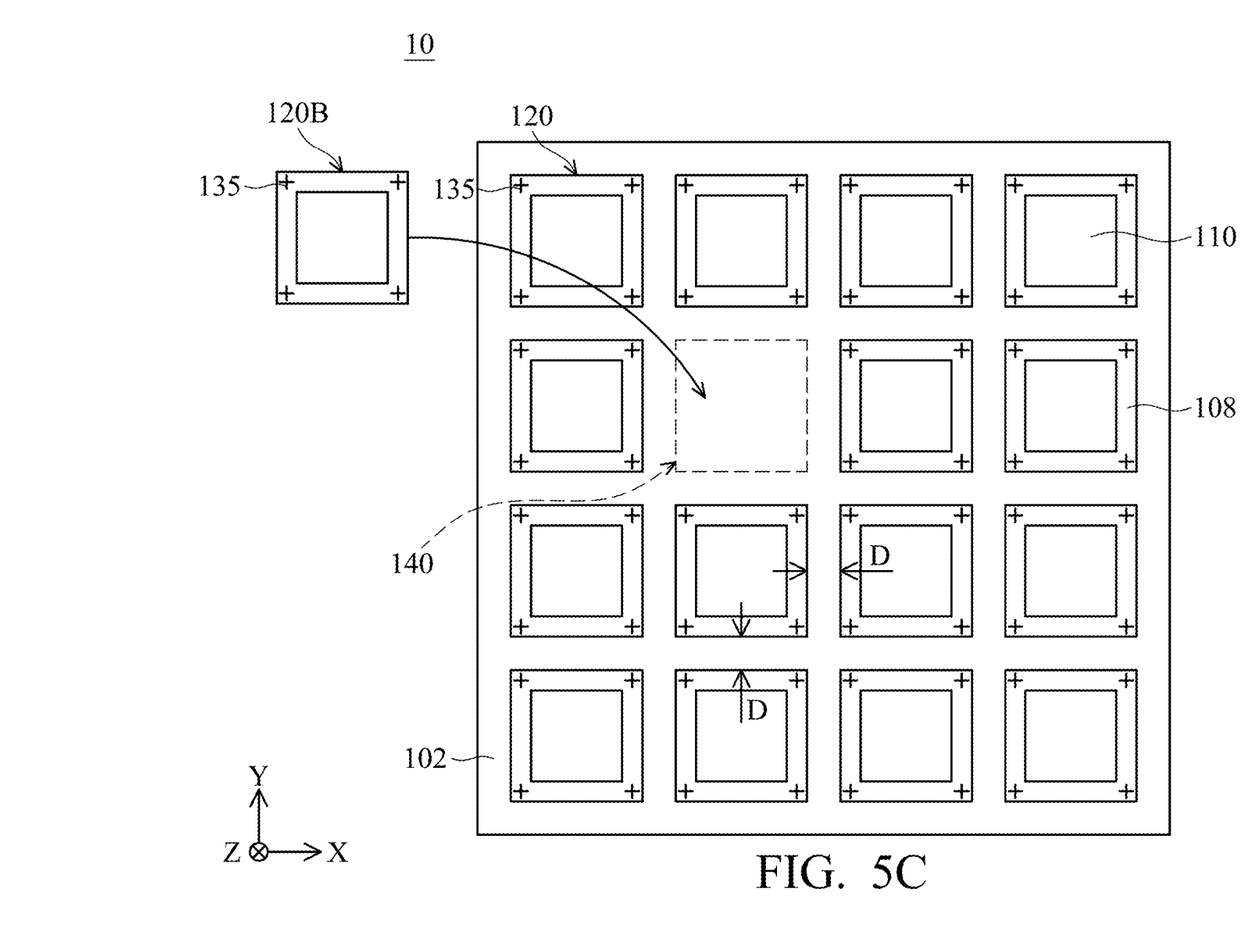
FIG. 5C is a top view illustrating attachment of a known good working unit to the carrier substrate according to some embodiments of the disclosure.

FIG. 5A is a cross-sectional view illustrating removal of a faulty working unit 120A from the carrier substrate 100 after performing a detection step on the working units 120 according to some embodiments of the disclosure, and FIG. 5B is a cross-sectional view illustrating attachment of a known good working unit 120B to the carrier substrate 100 according to some embodiments of the disclosure. FIG. 5C is a top view illustrating an example of attachment of the known good working unit 120B to the carrier substrate 100 according to some embodiments of the disclosure, but the disclosure is not limited thereto. As shown in FIG. 5A, each working unit may be subjected to a detection step after forming the connecting structure 110 to identify whether a faulty working unit is present. According to some embodiments, the detection step may include automated optical inspection (AOI), electrical detection, other applicable detection methods, or a combination thereof. The AOI may use optical instruments to inspect the surface of the working units, and detect the structural defects by the computer graphics imaging system. In addition, the aforementioned test-keys that formed between the working units may be used for the electric detection.

If a faulty working unit 120A is identified, a lift-off process 130 is performed to lift off the faulty working unit 120A from the carrier substrate 100. A suitable lift-off process may be selected according to the material of the first base layer 102 (e.g., a thermal-type release material or an optical-type release material) to lift off the faulty working unit 120A. Specifically, when the first base layer 102 includes a thermal-type release material, the carrier substrate 100 is subjected to localized heating to lift off the faulty working unit 120A from the carrier substrate 100. Alternatively, when the first base layer 102 includes an optical-type release material, laser light with a specific wavelength range is applied to the area where the faulty working unit 120A is located on the carrier substrate 100 to lift off the faulty working unit 120A from the carrier substrate 100. It should be noted that the optical-type release materials of the first base layer 102 and the second base layer 108 may have different laser absorption peaks when both the first base layer 102 and the second base layer 108 include optical-type release materials. Laser light with a wavelength other than the laser absorption peak of the second base layer 108 and near the laser absorption peak of the first base layer 102 may be adopted to prevent the connecting structure 100 in the faulty working unit 120A from lifting off from the sub-carrier 106.

Next, in some embodiments, the faulty working unit 120A may be repaired at a place other than the carrier substrate 100 to obtain a known good working unit 120B. Alternatively, in other embodiments, the faulty working unit 120A may not be repaired, and directly replaced with an existing known good working unit 120B instead. The term "known good working unit" used herein means a working unit whose structure and electric property meets design requirement and process standard after detection using the aforementioned detection methods, such as optical inspection, electric detection, or other applicable detection methods.

Thereafter, the known good working unit 120B is attached to the position on the carrier substrate 100 where the faulty working unit 120A has been lifted off. According to some embodiments, as shown in FIG. 5C, the connecting structure 110 in the working unit 120 is formed on a portion of the second base layer 108 such that the connecting structure 110 does not cover the whole upper surface of the second base layer 108. In this case, the region within the second base layer 108 that is not covered by the connecting structure 110 may be used for forming alignment marks. In some embodiments, at least one alignment mark 135 is formed on each second base layer 108 on the sub-carrier 106. Although each working unit 120 is shown to have 4 alignment marks 135 in FIG. 5C and each alignment mark 135 has a cross shape, the disclosure is not limited thereto. In other embodiments, more or fewer alignment marks 135 may be formed on the second base layer 108 according to design requirement, and the alignment marks 135 may be in any shape that is suitable for the tools in the attachment process and lift-off process to detect the location of the working units 120. It should be noted that detailed elements of the connecting structures 110 in the working units 120 are omitted for simplicity.

Furthermore, in accordance with some embodiments, the formation of the alignment marks 135 in the region within the second base layer 108 that is not covered by the connecting structure 110 may be simultaneous with the formation of any metal layer of the connecting structures 110. Therefore, in some embodiments, the alignment marks 135 and the metal layers in the connecting structures 110 may include the same material. Additionally, although the alignment marks 135 are shown to be formed on four corners of the second base layer 108, the disclosure is not limited thereto. In other embodiments, two alignment marks 135 may be formed on two opposite corners along the diagonal of the second base layer 108, or two alignment marks 135 may be formed on two corners on the same side of the second base layer 108.

In FIG. 5C, the recovered known good working unit 120B may be attached to the position 140 on the carrier substrate where the faulty working unit has been lifted off through the alignment marks 135 in the working units 120. As such, damage to adjacent working units 120 may be prevented when attaching the known good working unit 120B to the carrier substrate, and the known good working unit 120B may be attached accurately to the predetermined position 140.

Figure 6A:
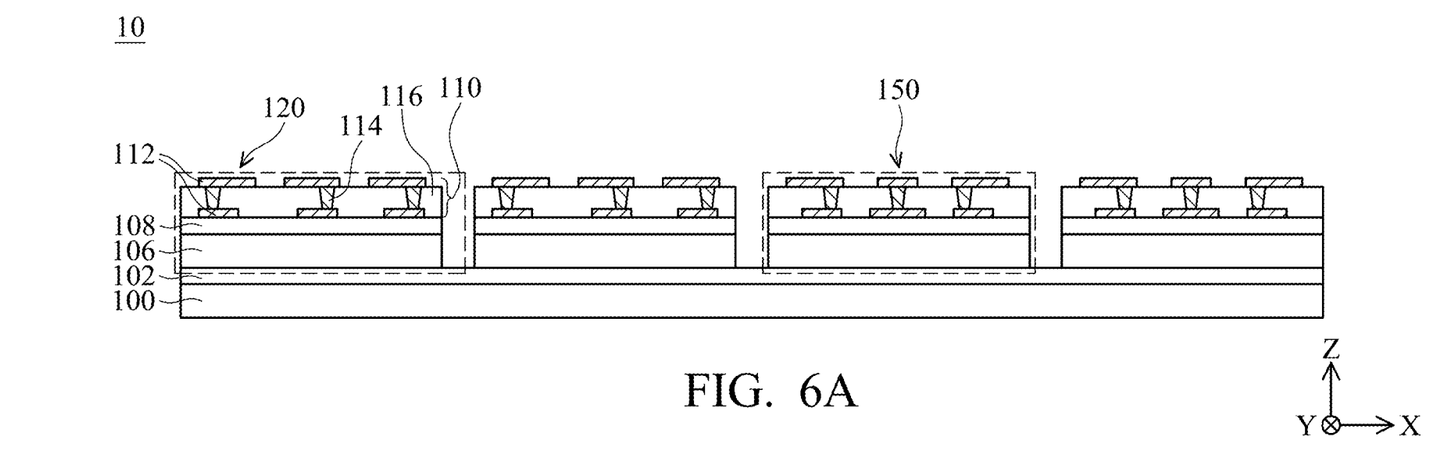
FIGS. 6A-6D and 7A-7B are cross-sectional views illustrating an electronic device at various intermediate stages of its manufacturing process according to various embodiments of the disclosure.
Figure 6B:
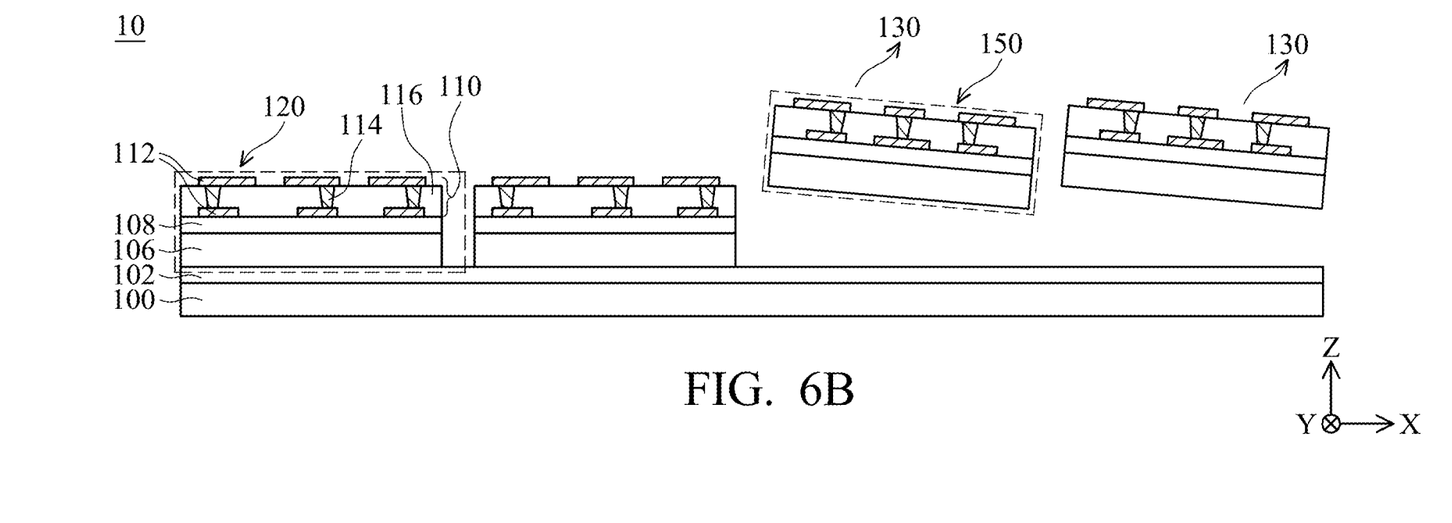
Figure 6C:
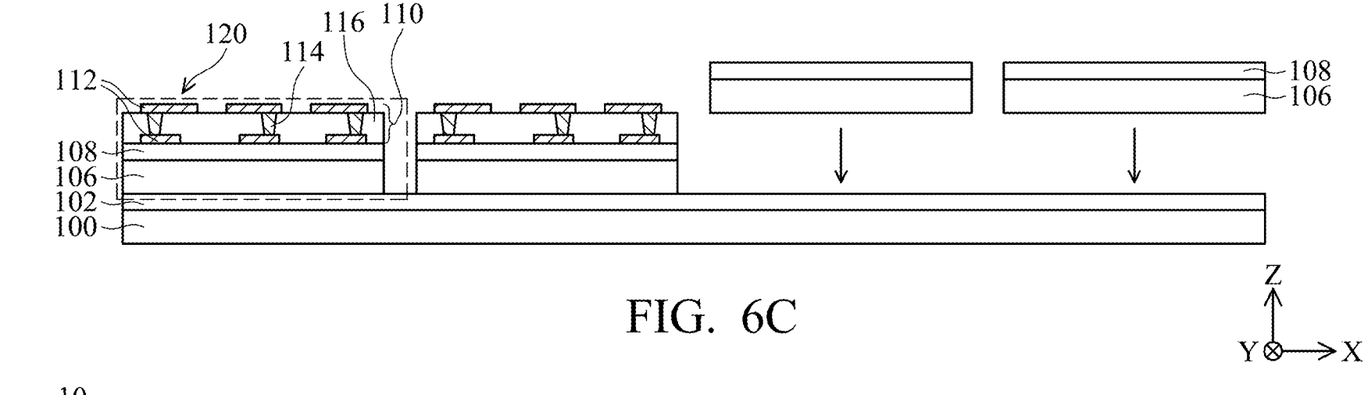
Figure 6D:
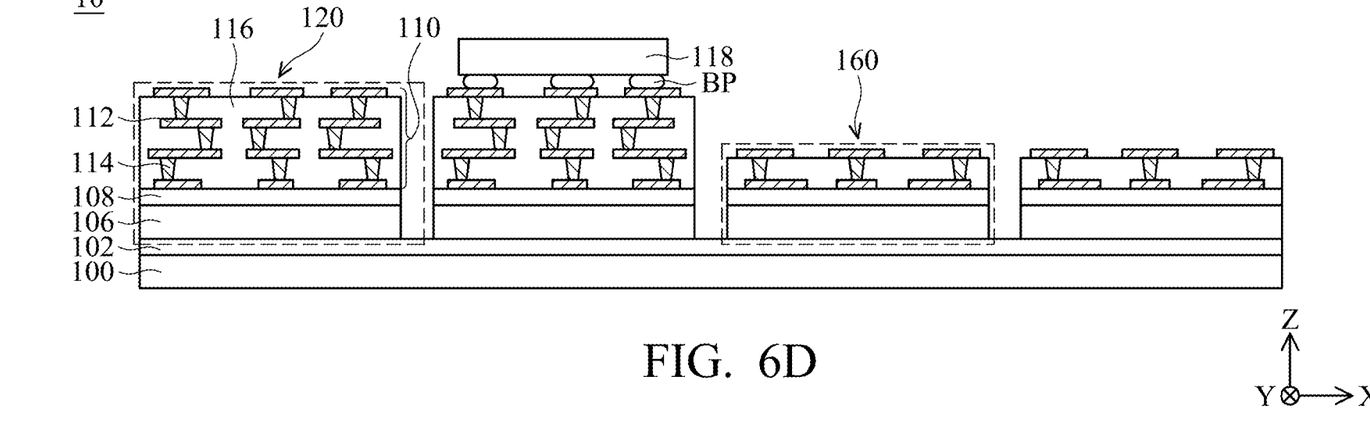

Referring to FIGS. 6A-6D, FIGS. 6A-6D are cross-sectional views illustrating the electronic device 10 at various intermediate stages of its manufacturing process according to various embodiments of the disclosure. According to some embodiments, as shown in FIG. 6A, the working units 120 and 150 may be formed to have the connecting structures 110 with the same number of metal layers 112 and conductive layers 114, but the wiring arrangements of the metal layers 112 and the conductive layers 114 in the working units 120 and 150 are different. In FIG. 6B, the same lift-off process 130 as mentioned earlier may be adopted to lift off the working units 150 that have already met product requirements, and the working units 120 remain on the carrier substrate 100 for the following process of the connecting structure 110. As shown in FIG. 6C, additional sub-carriers 106 and second base layers 108 may be attached to the position on the carrier substrate 100 where the working units are not present through the first base layers 102. Next, as shown in FIG. 6D, the process continues to form the connecting structures 110. Two metal layers 112 and two conductive layers 114 between the metal layers 112 are further formed on each working unit 120, and the connecting structures 110 that meet product requirements are also formed on the newly-attached sub-carriers 106. After completing the connecting structures 110, the working units 120 with the connecting structures 110 having four metal layers 112 may be achieved. Accordingly, in some embodiments, adjacent working units 120 and 160 may have different numbers of the metal layers.

According to the embodiments shown in FIGS. 6A-6D, the working units 120, 150 and 160 that meet different product requirements may be realized since multiple sub-carriers 106 are disposed on the carrier substrate 100, and the sub-carriers 106 are attached to the carrier substrate 100 through the first base layer 102. For example, the connecting structures 110 may be formed to have different numbers of the metal layers 112 and the conductive layers 114 (e.g., as shown in FIGS. 6C-6D), or the connecting structures 110 may be formed to have different wiring arrangements of the metal layers 112 and the conductive layers 114 (e.g., as shown in FIGS. 6A-6B).

According to some embodiments of the disclosure, further package processes may be performed on the carrier substrate 100, such as a die bonding process and a molding process. For example, referring to FIG. 6D, bonding pads BP may be formed on the metal layers 112. The number of bonding pads BP may depend on actual demand. The material of the bonding pads BP may include a metal, such as Ni, Cu, Au, Sn, or Al, but the disclosure is not limited thereto. Subsequently, at least one die 118 is bonded to the bonding pads BP. The method for manufacturing the electronic device 10 described with respect to FIGS. 6A-6D belongs to a redistribution layer first (RDL-first) process. In other embodiments, after completing the connecting structures 110, the working units 120, 150 and 160 may be lifted off from the carrier substrate 100 and subjected to the following processes at a place other than the carrier substrate 100. The carrier substrate 100 after lifting off the working units 120, 150 and 160 may be re-used for the formation of new working units.

Figure 7A:
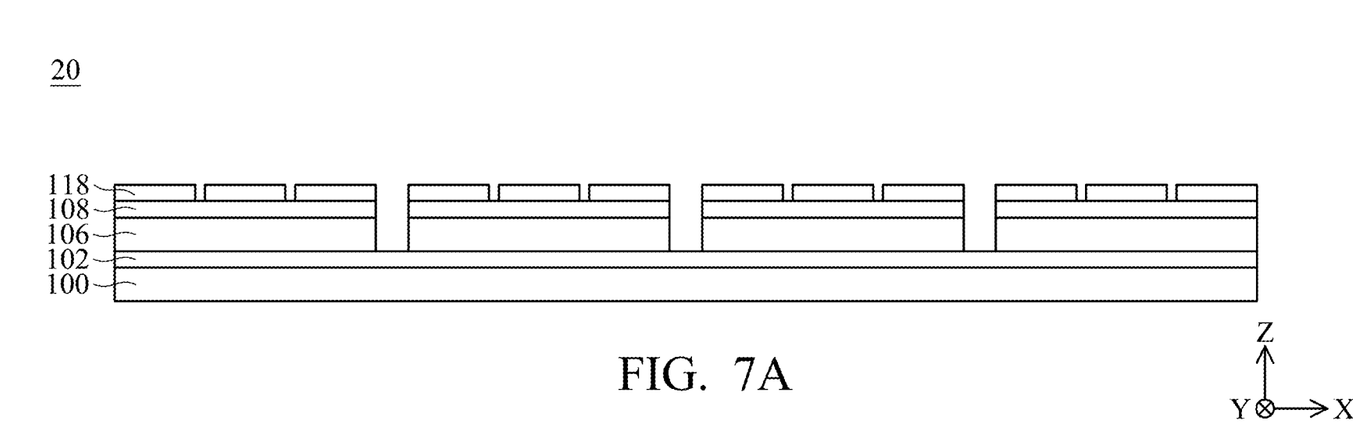
Figure 7B:
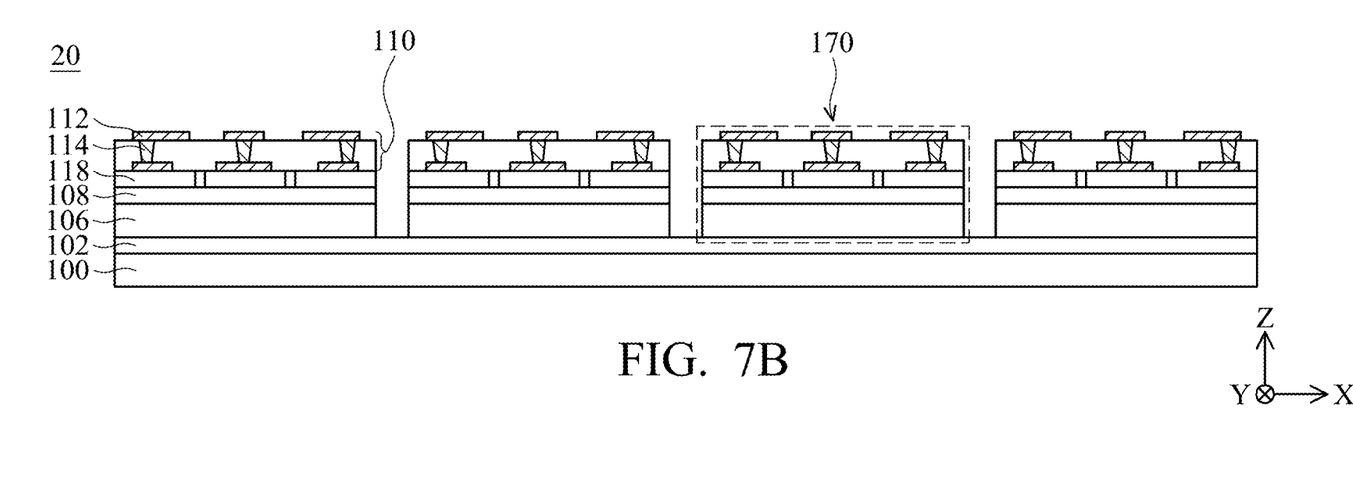

FIGS. 7A-7B are cross-sectional views illustrating an electronic device 20 at various intermediate stages of its manufacturing process according to other embodiments of the disclosure. Referring to FIG. 7A, according to some embodiments, at least one die 118 may be formed one the second base layer 108. Next, referring to FIG. 7B, the connecting structure 110 is formed on the dies 118 to manufacture a working unit 170. In the embodiments shown in FIGS. 7A-7B, the method for manufacturing the electronic device 20 belongs to a chip-first process. The chip-first process described in the disclosure may further include a chip face down process and a chip face up process. Likewise, the following processes of the working units 170 are not shown in the drawings. However, according to some embodiments, after completing the connecting structures 110, the following processes of the working units 170 may be performed on the carrier substrate 100, or the working units 170 may be lifted off from the carrier substrate 100 and subjected to the following processes at a place other than the carrier substrate 100. In addition, although three dies 118 are shown to be included in each working unit 170, the number of dies 118 disposed in each working unit 170 is not limited thereto. For example, according actual product requirements, 1, 2, 4, or more dies 118 may be disposed in each working unit 170. According to some embodiments, an example of the dies 118 may include a low noise amplifier (LNA), a low-loss filter, a power amplifier, a baseband circuit, a power management integrated circuit (PMIC), a memory, a micro electro mechanical system (MEMS) device, an integrated circuit (IC), other suitable active components, passive components, or a combination thereof, but the disclosure is not limited thereto.

In summary, according to some embodiments of the disclosure, the provided method for manufacturing an electronic device disposes multiple sub-carriers that are spaced apart from one another on the carrier substrate. Each sub-carrier may be used as a minimum unit to complete respective working units. As such, warpage of the carrier substrate and the working units may be reduced, and the impact on the following processes due to warpage may be reduced accordingly. For example, warpage may lead to exposure pattern distortion. In addition, the materials with different stiffness may be used for the carrier substrate and the sub-carriers, and thus the choice of materials for the carrier substrate and the sub-carriers is less restricted. For example, a carrier substrate with high mechanical strength and high stiffness may be used for the formation of the electronic device to further prevent the electronic device from warpage. On the other hand, the first base layer is formed between the carrier substrate and the sub-carriers, the faulty working units may be lifted off from the carrier substrate for repair if the working units are detected to be faulty. The recovered known good working units may be re-attached to the carrier substrate, preventing adjacent working units from damage and reduce in process yield. In addition, after completing the working units, the working units may be lifted off from the carrier substrate, and the same carrier substrate may be re-used to form new working units. Moreover, working units may be formed to have different connecting structures (e.g., having different numbers of the metal layers and the conductive layers, or having different wiring arrangements of the metal layers and the conductive layers) during the process for forming the connecting structure to realize a variety of product requirements.

Although some embodiments of the disclosure and their advantages have been described in detail, it should be understood that various changes, substitutions and alterations can be made herein without departing from the spirit and scope of the disclosure. The features between embodiments of the disclosure may be arbitrarily applied to one another without departing from the spirit and scope of the disclosure. Moreover, the scope of the present application is not intended to be limited to the particular embodiments of the process, machine, manufacture, composition of matter, means, methods and steps described in the specification. As a person having ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. The scope of the present disclosure shall be defined by the appended claims. Any one of embodiments or claims of the present disclosure do not have to achieve all the aspects, advantages or features disclosed in the disclosure.

What is claimed is:

1. A method for manufacturing an electronic device, comprising:
   providing a carrier substrate;
   forming a first base layer on the carrier substrate;
   forming working units on the first base layer, wherein the working units are spaced apart from one another;
   performing a detection step on the working units to identify whether a faulty working unit is present;
   if a faulty working unit is identified, lifting off the faulty working unit from the carrier substrate;
   repairing the faulty working unit to obtain a known good working unit; and
   attaching the known good working unit to a position on the carrier substrate where the faulty working unit has been lifted off.

2. The method of claim 1, wherein forming the working units on the first base layer comprises forming a substrate on the first base layer, and cutting the substrate into sub-carriers that are spaced apart from one another.

3. The method of claim 1, wherein forming the working units on the first base layer comprises attaching sub-carriers on the first base layer, and wherein the sub-carriers are spaced apart from one another.

4. The method of claim 1, wherein forming the working units on the first base layer comprises disposing the working units on the first base layer with a spacing along a lateral direction, and wherein the spacing is greater than or equal to 1 mm and less than or equal to 50 mm.

5. The method of claim 1, wherein at least one alignment mark is formed on each of the working units, and wherein attaching the known good working unit comprises attaching the known good working unit to the position on the carrier substrate where the faulty working unit has lifted off using the alignment marks on the working units.

6. The method of claim 1, wherein the detection step comprises automated optical inspection (AOI), electrical detection, or a combination thereof.

7. The method of claim 1, wherein each of the working units comprises:
   a sub-carrier;
   a second base layer formed on the sub-carrier; and
   a connecting structure formed on the second base layer.

8. The method of claim 7, wherein the first base layer comprises a thermal-type release material, and the second base layer comprises an optical-type release material.

9. The method of claim 7, wherein the first base layer comprises a first optical-type release material, and the second base layer comprises a second optical-type release material that has a different laser absorption peak than the first base layer.

10. The method of claim 7, wherein each of the connecting structure of the working units comprises metal layers, and wherein a number of the metal layers of the connecting structure in at least one of the working units is different from a number of the metal layers of the respective connecting structure in the remaining working units.

11. The method of claim 7, wherein a thickness of the carrier substrate is different from a thickness of the sub-carrier.

12. The method of claim 11, wherein the thickness of the carrier substrate is greater than the thickness of the sub-carrier.

13. The method of claim 11, wherein the thickness of the carrier substrate is greater than or equal to 0.7 mm and less than or equal to 1.5 mm, and the thickness of the sub-carrier is greater than or equal to 0.3 mm and less than or equal to 1.1 mm.

14. The method of claim 7, wherein a coefficient of thermal expansion of the carrier substrate is different from a coefficient of thermal expansion of the sub-carrier.

15. The method of claim 14, wherein the coefficient of thermal expansion of the carrier substrate is less than the coefficient of thermal expansion of the sub-carrier.

16. The method of claim 14, wherein the coefficient of thermal expansion of the carrier substrate is greater than or equal to 9 ppm/° C. and less than or equal to 20 ppm/° C., and the coefficient of thermal expansion of the sub-carrier is greater than or equal to 9 ppm/° C. and less than or equal to 20 ppm/° C.

17. The method of claim 7, wherein a Young's modulus of the carrier substrate is different from a Young's modulus of the sub-carrier.

18. The method of claim 17, wherein the Young's modulus of the carrier substrate is less than the Young's modulus of the sub-carrier.

19. The method of claim 17, wherein the Young's modulus of the carrier substrate is greater than or equal to 70 GPa and less than or equal to 220 GPa, and the Young's modulus of the sub-carrier is greater than or equal to 50 GPa and less than or equal to 90 GPa.

* * * * *